United States Patent
Lagnado et al.

(10) Patent No.: US 7,388,247 B1
(45) Date of Patent: Jun. 17, 2008

(54) HIGH PRECISION MICROELECTROMECHANICAL CAPACITOR WITH PROGRAMMABLE VOLTAGE SOURCE

(75) Inventors: Isaac Lagnado, San Diego, CA (US); Paul R. de la Houssaye, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 49 days.

(21) Appl. No.: 10/446,615

(22) Filed: May 28, 2003

(51) Int. Cl.
*H01L 27/108* (2006.01)

(52) U.S. Cl. .................... 257/312; 257/595; 257/600; 257/602; 257/E29.325; 257/E29.344; 361/277; 361/290

(58) Field of Classification Search .............. 257/312, 257/532, 595, 600, 602, E27.048, E29.325, 257/E29.343, E29.344; 361/277, 278, 290
See application file for complete search history.

(56) References Cited

U.S. PATENT DOCUMENTS

| | | | |
|---|---|---|---|
| 4,129,863 A | 12/1978 | Gray et al. | |
| 4,245,165 A * | 1/1981 | Hoffman | 327/546 |
| 4,399,426 A | 8/1983 | Tan | |
| 4,404,544 A | 9/1983 | Dwarakanath | |
| 4,918,454 A | 4/1990 | Early et al. | |
| 5,006,854 A | 4/1991 | White et al. | |
| 5,305,004 A * | 4/1994 | Fattaruso | 341/120 |
| 5,377,524 A | 1/1995 | Wise et al. | |
| 6,232,841 B1 * | 5/2001 | Bartlett et al. | 330/305 |
| 6,441,449 B1 * | 8/2002 | Xu et al. | 257/414 |
| 6,448,064 B1 * | 9/2002 | Vo-Dinh et al. | 435/287.2 |
| 6,448,604 B1 | 9/2002 | Funk et al. | |
| 6,541,814 B1 | 4/2003 | Cao et al. | |
| 6,829,132 B2 * | 12/2004 | Martin et al. | 361/278 |
| 2004/0217378 A1 | 11/2004 | Martin et al. | |
| 2004/0218251 A1 | 11/2004 | Piehl et al. | |
| 2004/0218341 A1 | 11/2004 | Martin et al. | |
| 2004/0240138 A1 * | 12/2004 | Martin et al. | 361/139 |
| 2004/0262645 A1 * | 12/2004 | Huff et al. | 257/232 |

OTHER PUBLICATIONS

Reid R. Harrison et al., A CMOS Programmable Analog Memory-Cell Array Using Floating-Gate Circuits, IEEE Transactions on Circuits and Systems—II Analog and Digital Signal Processing, vol. 48 ,No. 1. Jan. 2001.
Paul Hasler, et al., Floating-Gate Devices: They Are Not Just For Digital Memories Anymore.

(Continued)

*Primary Examiner*—Matthew E Warren
(74) *Attorney, Agent, or Firm*—Peter A. Lipovsky; Arthur K. Samora; J. Eric Anderson

(57) ABSTRACT

A high precision microelectromechanical capacitor with programmable voltage source includes a monolithic MEMS device having a capacitance actuator, a trim capacitor, and a high precision, programmable voltage source. The trim capacitor has a variable capacitance value, preferably for making fine adjustments in capacitance. The capacitance actuator is preferably mechanically coupled to and electrically isolated from the trim capacitor and is used to control the capacitance value of the trim capacitor. The capacitance adjustment of the trim capacitor is non-destructive and may be repeated indefinitely. The trim capacitor may be adjusted by mechanically changing the distance between its electrodes. The programmable voltage source provides a highly accurate and stable output voltage potential corresponding to control signals for controlling the capacitance actuator. The programmable voltage source may optionally include a floating-gate transistor coupled to an amplifier for storing charge and therefore, providing a non-volatile, stable, and adjustable output voltage potential.

16 Claims, 7 Drawing Sheets

OTHER PUBLICATIONS

Paul Hasler et al., Adaptive Circuits Using pFET Floating-Gate Devices.

Daniel Saias, et al., An Above-IC RF-MEMS Switch, ISSCC 2003/Session 11 Microsensors and Biomems /Paper 11.8 2003.

* cited by examiner

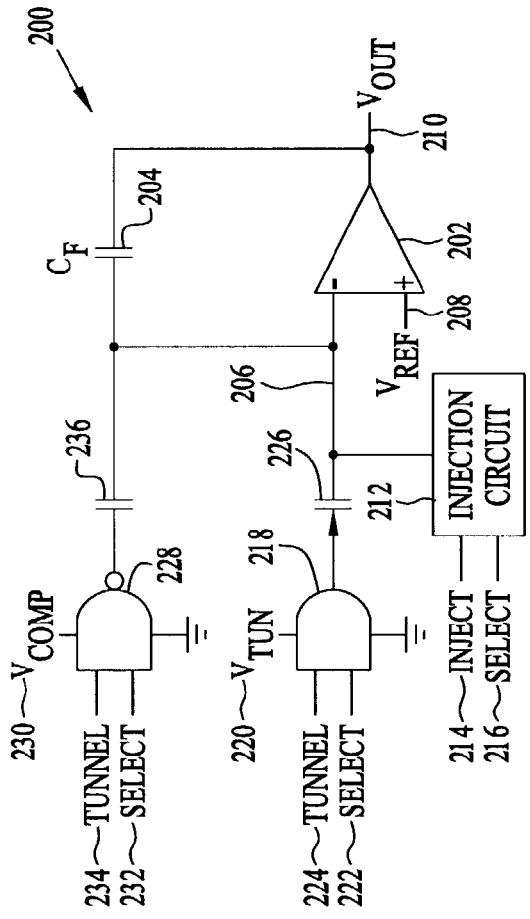
FIG. 2A
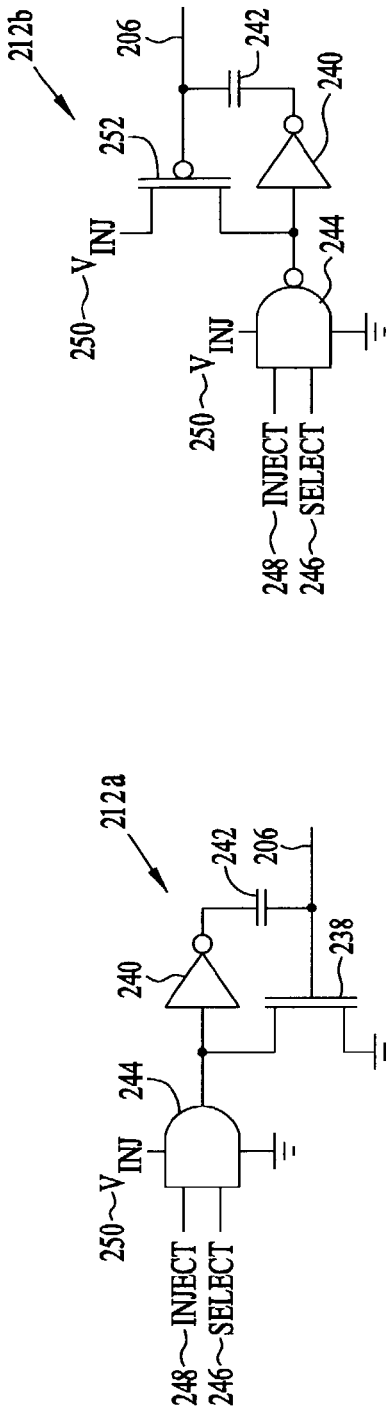
FIG. 2C
FIG. 2B

HIGH PRECISION MICROELECTROMECHANICAL CAPACITOR WITH PROGRAMMABLE VOLTAGE SOURCE

FEDERALLY-SPONSORED RESEARCH AND DEVELOPMENT

The present invention is assigned to the United States Government and is available for licensing for commercial purposes. Licensing and technical inquiries should be directed to the Office of Patent Counsel, Space and Naval Warfare Systems Center, San Diego, Code 20012, San Diego, Calif., 92152; telephone (619)553-3001, facsimile (619)553-3821.

BACKGROUND OF THE INVENTION

The high precision microelectromechanical capacitor with programmable voltage source generally relates to monolithic microelectromechanical system (MEMS) devices, and more particularly, to a monolithic device including a MEMS capacitor and a programmable voltage source.

Several techniques are known for adjusting/trimming integrated capacitors within electronic functions. One well-known technique includes removing material by lithography and etching. This method tends to be permanent and must be done as part of the fabrication process. Also, this technique fails to satisfy the requirements of a system that may need continuous and fine-tuned adjustments.

Another well-known technique to create a variable capacitor employs the use of microelectromechanical system (MEMS) capacitors. Traditional MEMS (variable) capacitors include some sort of mechanical or electrostatic actuator to alter the position of the electrodes or the dielectric. The use of MEMS capacitors has several benefits such as, the adjustments are non-destructive, reversible and the MEMS capacitors have high capacitance density-to-size ratios, thereby reducing the overall size of the system.

Traditionally, MEMS capacitors and other analog systems are biased with parameters that are stored off-chip. A traditional analog system 400 is illustrated in FIG. 4. There, analog parameters and biases are physically stored off the analog VLSI circuit 406, by passive components, such as potentiometers 404. This reliance on off-chip biases consumes a number of the chip's pins and thereby limits the complexity of the analog VLSI circuit 406. In addition, potentiometers 404 are relatively inaccurate and susceptible to variations in temperature, humidity, and other physical parameters, such as noise. When used for systems, such as high performance digital-to-analog converters, the inaccuracies of the off-chip biases leads to non-linearities in performance and can limit effective precision.

Recent advances in floating-gate CMOS circuitry have allowed the possibility of integrating highly accurate, stable, and programmable voltage sources into VLSI systems. See Harrison, R., Bragg, J., Hasler, P., Minch, B., Deweerth, S., "A CMOS Programmable Analog Memory-Cell Array Using Floating-Gate Circuits." IEEE Transactions on Circuits and Systems-TI: Analog and Digital Signal Processing, Vol. 48, NO. 1, (January 2001): pp. 4-11, hereby incorporated by reference. Through the use of floating-gate MOS transistors to store charge, voltage potentials may be programmed (set) by the process of tunneling and hot-electron injection.

One of the most complex and difficult aspects of high-performance, SIGMA-DELTA analog-to-digital converters (SIGMA-DELTA ADC) is the inherent non-linearities of the multi-bit digital-to-analog converter in the front-end. The accuracy of a DAC, using a binary-weighted capacitor array, is directly dependent upon the ratio of each capacitor in the array being exactly two times (in capacitance) the capacitor preceding it. The fabrication of each capacitor, however, typically does not allow for a uniformity that is better than a certain tolerance.

Therefore, it can be appreciated that a monolithic device that includes a highly accurate, stable, and programmable MEMS capacitor is needed.

SUMMARY OF THE INVENTION

The high precision microelectromechanical capacitor with programmable voltage source provides a monolithic MEMS device having a capacitance actuator, a trim capacitor, and a high precision, programmable voltage source that address the problems mentioned previously.

In one embodiment, the high precision microelectromechanical capacitor with programmable voltage source includes a trim capacitor having a variable capacitance value. The trim capacitor is preferably designed for making fine adjustments in capacitance when it is optionally coupled to a fixed capacitor. The high precision microelectromechanical capacitor with programmable voltage source also includes a capacitance actuator for non-destructive adjustments of the trim capacitor. A programmable voltage source is also provided for controlling the capacitance actuator with a highly accurate and stable output voltage potential that corresponds to a set of input control signals.

In a second embodiment, the high precision microelectromechanical capacitor with programmable voltage source provides a monolithic device that includes a digital-to-analog converter (DAC). The DAC includes a plurality of trim capacitors, each having a variable capacitance value. The trim capacitors are preferably designed for making fine adjustments in capacitance when they are optionally coupled to fixed capacitors. The DAC also includes a plurality of capacitance actuators for non-destructively adjusting the trim capacitors. Programmable voltage sources are also provided for controlling the capacitance actuators with highly accurate and stable output voltage potentials that correspond to sets of input control signals.

In a third embodiment, the high precision microelectromechanical capacitor with programmable voltage source provides a monolithic device that includes a SIGMA-DELTA analog-to-digital converter (SIGMA-DELTA ADC). The SIGMA-DELTA ADC includes a voltage comparator, an integrator, a analog-to-digital converter (quantizer), and a high-precision digital-to-analog (DAC) converter. The DAC includes a plurality of trim capacitors, each having a variable capacitance value. The trim capacitors are preferably designed for making fine adjustments in capacitance when they are optionally coupled to fixed capacitors. The DAC also includes a plurality of capacitance actuators for non-destructively adjusting the trim capacitors. Programmable voltage sources are also provided for controlling the capacitance actuators with highly accurate and stable output voltage potentials that correspond to sets of input control signals.

In a fourth embodiment, a method of making the high precision microelectromechanical capacitor with programmable voltage source is provided. The first step is forming a trim capacitor having a variable capacitance value on a substrate. The trim capacitor is preferably designed for making fine adjustments in capacitance when it is optionally coupled to a fixed capacitor. The second step includes forming a capacitance actuator on the substrate for non-destructive adjustments of the trim capacitor. The last step includes forming a programmable voltage source on the substrate for controlling the capacitance actuator with a highly accurate and stable output voltage potential that corresponds to a set of input control signals.

In a fifth embodiment a method of making the high precision microelectromechanical capacitor with programmable voltage source includes forming a monolithic device having a digital-to-analog converter (DAC). The method includes the steps of: 1.) forming a plurality of trim capacitors having a variable capacitance value on a substrate where the trim capacitors are preferably fabricated for making fine, or relatively small, adjustments in capacitance when optionally coupled to fixed capacitors of larger capacitance; 2.) forming a plurality of capacitance actuators on the substrate for non-destructive adjustments of the trim capacitors; and 3.) forming programmable voltage sources on the substrate for controlling the capacitance actuators with highly accurate and stable output voltage potentials that correspond to sets of input control signals.

An advantage of the high precision microelectromechanical capacitor with programmable voltage source is that when incorporated into a circuit to adjust a much larger fixed capacitor it can correct for the inherent inaccuracies encountered in capacitor fabrication.

Another advantage of the high precision microelectromechanical capacitor with programmable voltage source is that it provides highly stable and continuously-adjustable capacitance values.

Yet, another advantage of the high precision microelectromechanical capacitor with programmable voltage source is that the programmable voltage source may be non-volatile, thereby allowing restoration of trim capacitance values after power loss.

Still, another advantage of the high precision microelectromechanical capacitor with programmable voltage source is a substantial increase in the linearity of high-performance digital-to-analog converters and the dynamic range of SIGMA-DELTA analog-to-digital converters.

Another advantage of the high precision microelectromechanical capacitor with programmable voltage source is that the MEMS capacitor and voltage source may be integrated onto VLSI circuits, thereby reducing pin requirements, and allowing for an increase in chip complexity.

The previously summarized features and advantages along with other aspects of the high precision microelectromechanical capacitor with programmable voltage source will become clearer upon review of the following specification taken together with the included drawings.

BRIEF DESCRIPTION OF THE DRAWING

FIG. 2a further illustrates a portion of the schematic diagram illustrated in FIG. 1.

FIG. 2b further illustrates a portion of the schematic diagram illustrated in FIG. 2A.

FIG. 2c further illustrates a portion of the schematic diagram illustrated in FIG. 2A.

DESCRIPTION OF SOME EMBODIMENTS

Following is a glossary of terms used to describe the high precision microelectromechanical capacitor with programmable voltage source. The definitions set forth in the glossary are representative of the intended meanings as used herein.

GLOSSARY

The term "capacitance actuator" means an actuator that controls the capacitance of a variable capacitor.

The term "continuously-adjustable capacitance value" means the capacitance adjustment is non-destructive to the device and may be adjusted back and forth along the intended analog range of capacitance values.

The terms "microelectromechanical system" and "MEMS" means a system that integrates microelectronics with micromechanical parts.

The term "monolithic" means formed in situ upon or within a semiconductor substrate.

The term "non-volatile" means a device that maintains its information in the absence of power. In terms of the high precision microelectromechanical capacitor with programmable voltage source, "non-volatile" means the programmable voltage source resumes the same output voltage when supply power is removed then subsequently restored.

The term "trim capacitor" means a variable capacitor of relatively small capacitance used for making fine adjustments.

Figure 1:
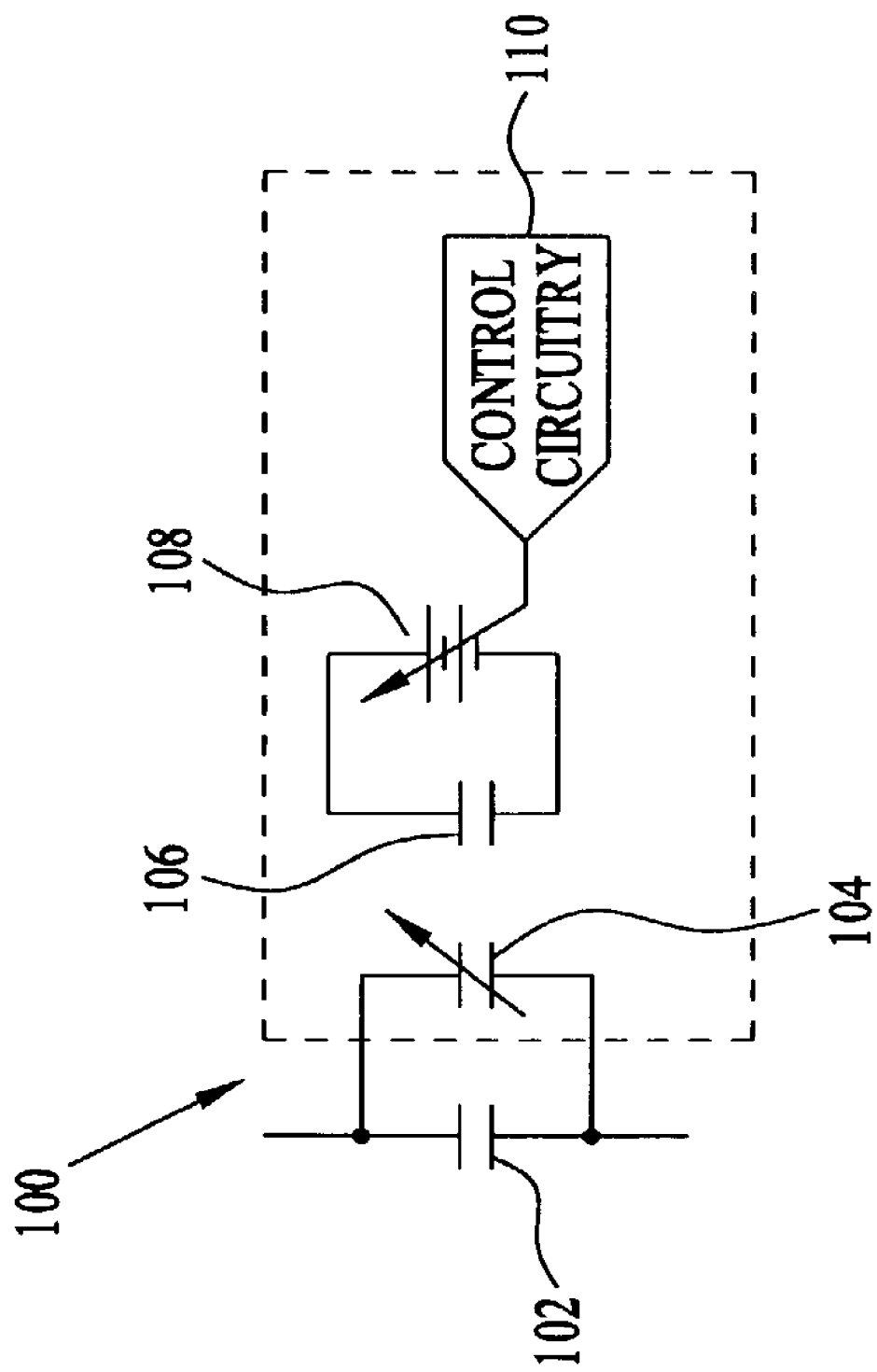
FIG. 1 illustrates a schematic diagram, in accordance with the high precision microelectromechanical capacitor with programmable voltage source.

The high precision MEMS capacitor with programmable voltage source 100, shown in FIG. 1, includes trim capacitor 104, capacitance actuator 106, and programmable voltage source 108. Trim capacitor 104 has a continuously-adjustable capacitance value and is preferably designed for making fine adjustments in capacitance when optionally coupled to fixed capacitor 102. Adjustments of trim capacitor 104 are controlled by capacitance actuator 106, which is mechanically coupled to and electrically isolated from trim capacitor 104. Although FIG. 1 shows capacitance actuator 106 as a capacitor, it may be appreciated that any form of mechanical or electrostatic actuation of a trim capacitor may be utilized.

Figure 3:
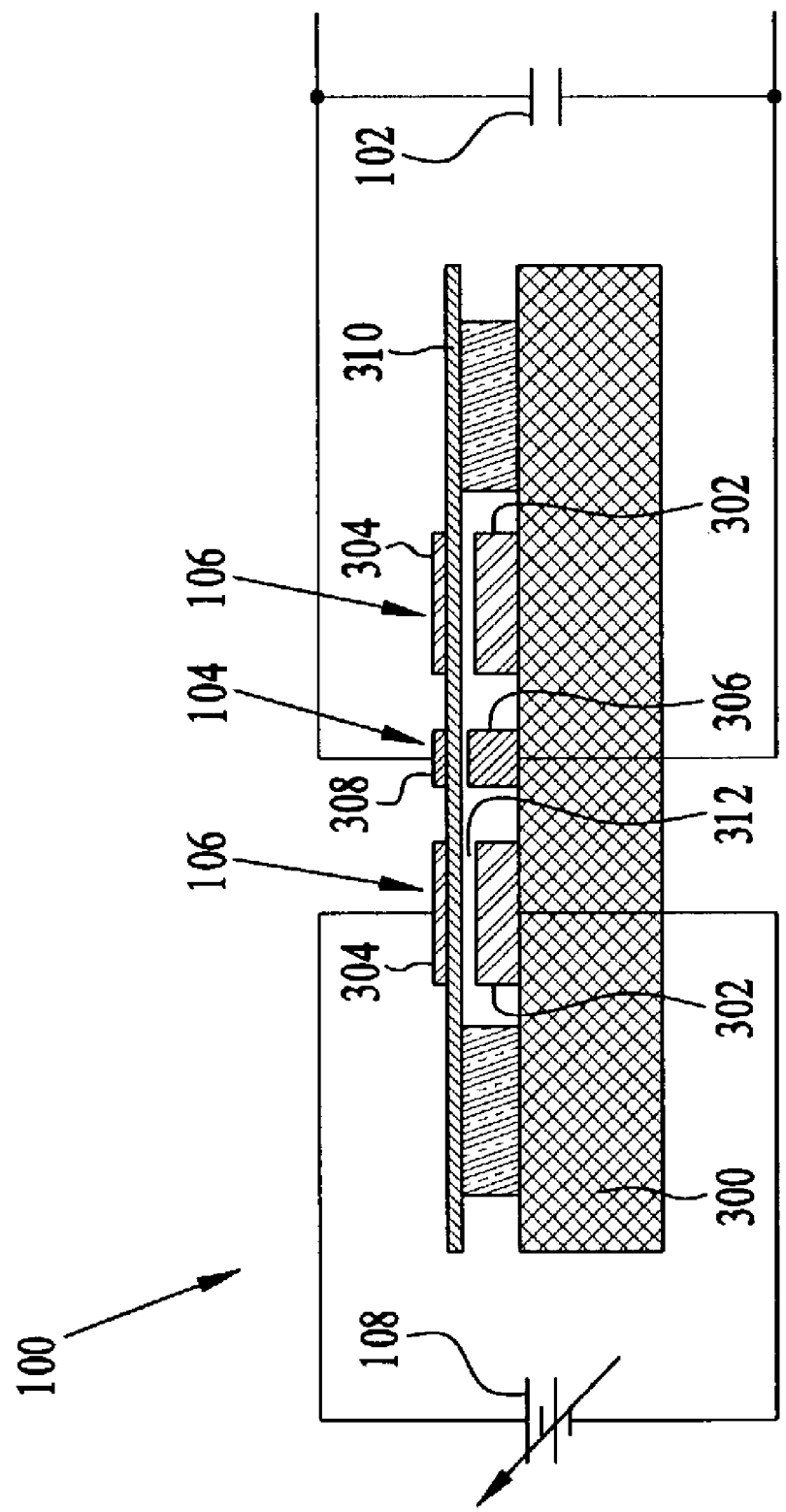
FIG. 3 illustrates a cross-sectional diagram of a microelectromechanical capacitor, in accordance with the high precision microelectromechanical capacitor with programmable voltage source.
Figure 4:
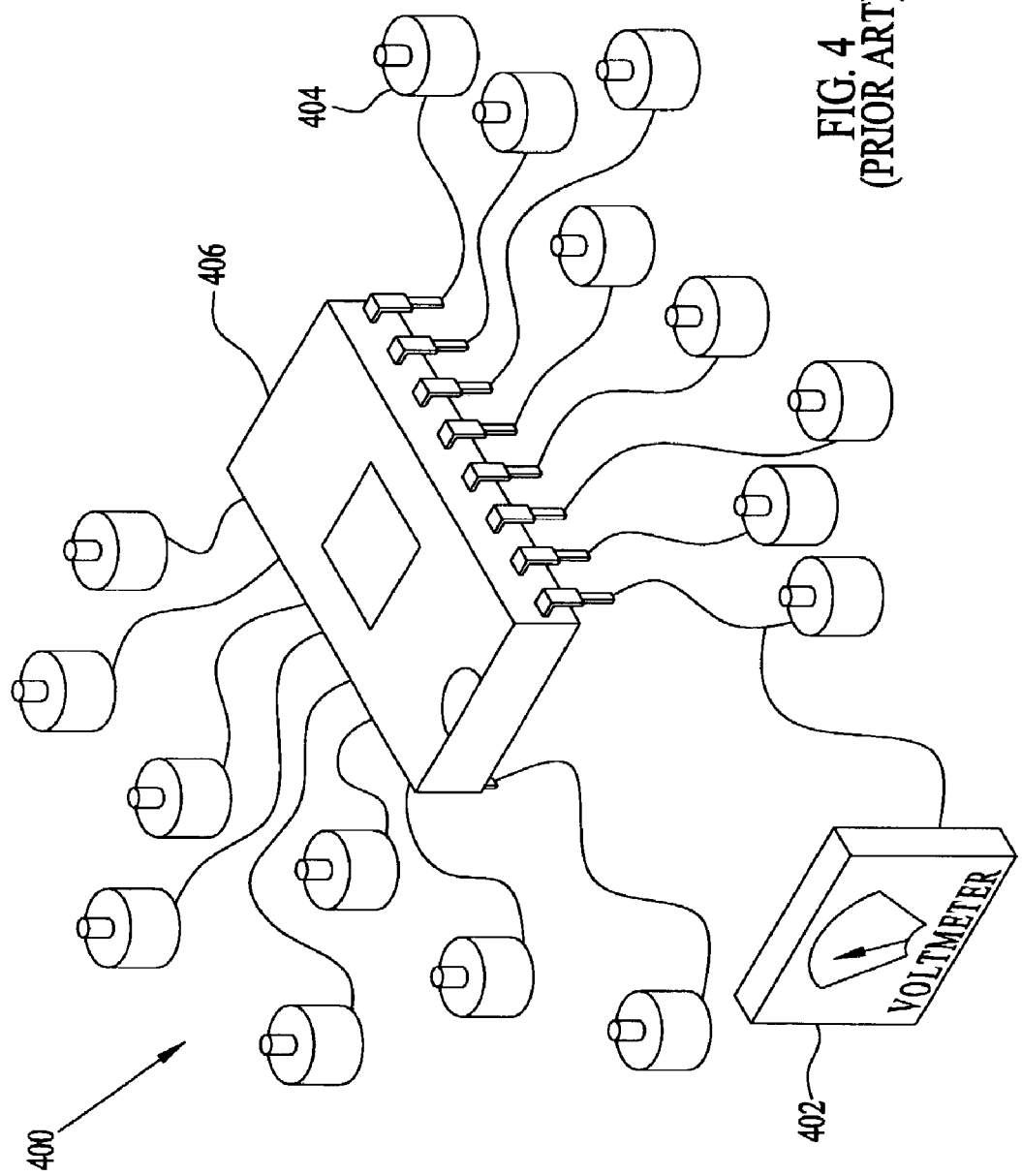
FIG. 4 illustrates a prior art biasing technique.

By way of example, FIG. 3 shows a cross-sectional diagram of a mechanical coupling between capacitance actuator 106 and trim capacitor 104, in accordance with the high precision MEMS capacitor with programmable voltage source 108. Trim capacitor 104 includes a first stationary electrode 306 and a second movable electrode 308, formed on substrate 300. Capacitance actuator 106 includes a third stationary electrode 302 and a fourth movable electrode 304. Although FIG. 3 shows two capacitance actuators 106, it may be appreciated that any suitable number, including one or more actuators, may be implemented for appropriate adjustment of trim capacitor 104.

Disposed between the movable and fixed electrodes is shared flexible dielectric layer 310. Flexible dielectric layer 310 allows for the deflection of electrode 304, caused by an electrostatic force created by application of a voltage potential across electrodes 302 and 304. This deflection of flexible dielectric layer 310 also results in movement of electrode 308 of trim capacitor 104, such that the capacitance of trim capacitor 104 is changed. Preferably, the changes in capacitance of trim capacitor 104 are relatively small when compared with the changes in capacitance of capacitance actuator 106. One way this may be accomplished is by utilizing the inherent roughness of the materials used for electrodes 306 and 308 and flexible dielectric layer 310. Thus, as electrodes 302 and 304 are deflected the contact force between electrodes 306 and 308 changes, thereby changing the effective dielectric area between electrodes 306 and 308 and causing a very fine variation of capacitance in trim capacitor 104. With the proper choice of materials along with the appropriate thickness of flexible dielectric layer 310, microphonics can be reduced or eliminated. It may be appreciated that other methods of varying the capacitance may be implemented, some of which include methods where electrode 306 does not contact, or may only partially contact, dielectric layer 310.

Referring back to FIG. 1, capacitance actuator 106 controls the capacitance of trim capacitor 104 in response to a highly accurate and stable voltage potential supplied by programmable voltage source 108. Programmable voltage source 108 outputs this voltage potential in response to control signals provided by control circuitry 110.

An example of the programmable voltage source 108 is shown in FIG. 2A as hot-electron/tunneling circuit 200. The floating-gate of a floating-gate transistor is connected to the negative input 206 of an amplifier 202 with feedback capacitor CF 204. This pins the floating-gate voltage to $V_{REF}$ 208 and allows $V_{OUT}$ 210 to be moved from rail to rail by changing the charge of the floating gate 206. Charge is removed from the floating gate 206 through tunneling. The tunneling voltage 220 is switched by high voltage AND gate 218, which may include a high-voltage differential amplifier built with lightly doped-drain nFETs. The capacitive coupling of the tunneling voltage to the floating gate 206 is counterbalanced by switching a lower compensation voltage 230 with NAND gate 228 through a larger capacitor 236. Tunneling control signals 222, 224, 232, and 234 are used for controlling the previously described tunneling by gates 218 and 228 and may optionally include discrete digital signals. These tunneling control signals may be provided by optional control circuitry 110, as shown in FIG. 1.

Charge is added to floating-gate 206 through hot-electron injection by injection circuit 212. Two examples of injection circuits 212a and 212b are shown in FIGS. 2B and 2C, respectively. Injection circuit 212a utilizes a nFET 238, while injection circuit 212b utilizes a pFET 252. In both injection circuits 212a and 212b an inverter 240 is used in the compensation circuitry to offset the capacitive coupling into the floating gate 206 through the drain-to-channel capacitor. Injection control signals 214, 216, 246, and 248 are used for controlling the previously described hot-electron injection by injection circuits 212, 212a, and 212b and may optionally include discrete digital signals. These injection control signals may be provided by optional control circuitry 110, as shown in FIG. 1.

Integrating a floating-gate transistor coupled to an amplifier for storing charge and therefore, providing an output voltage potential provides numerous benefits for the high precision MEMS capacitor with programmable voltage source. Among them are: 1.) increased programming accuracy and precision; 2.) reduced long-term drift; 3.) non-volatility; and 4.) reduction in chip pin requirements, thereby reducing cost.

Figure 7:
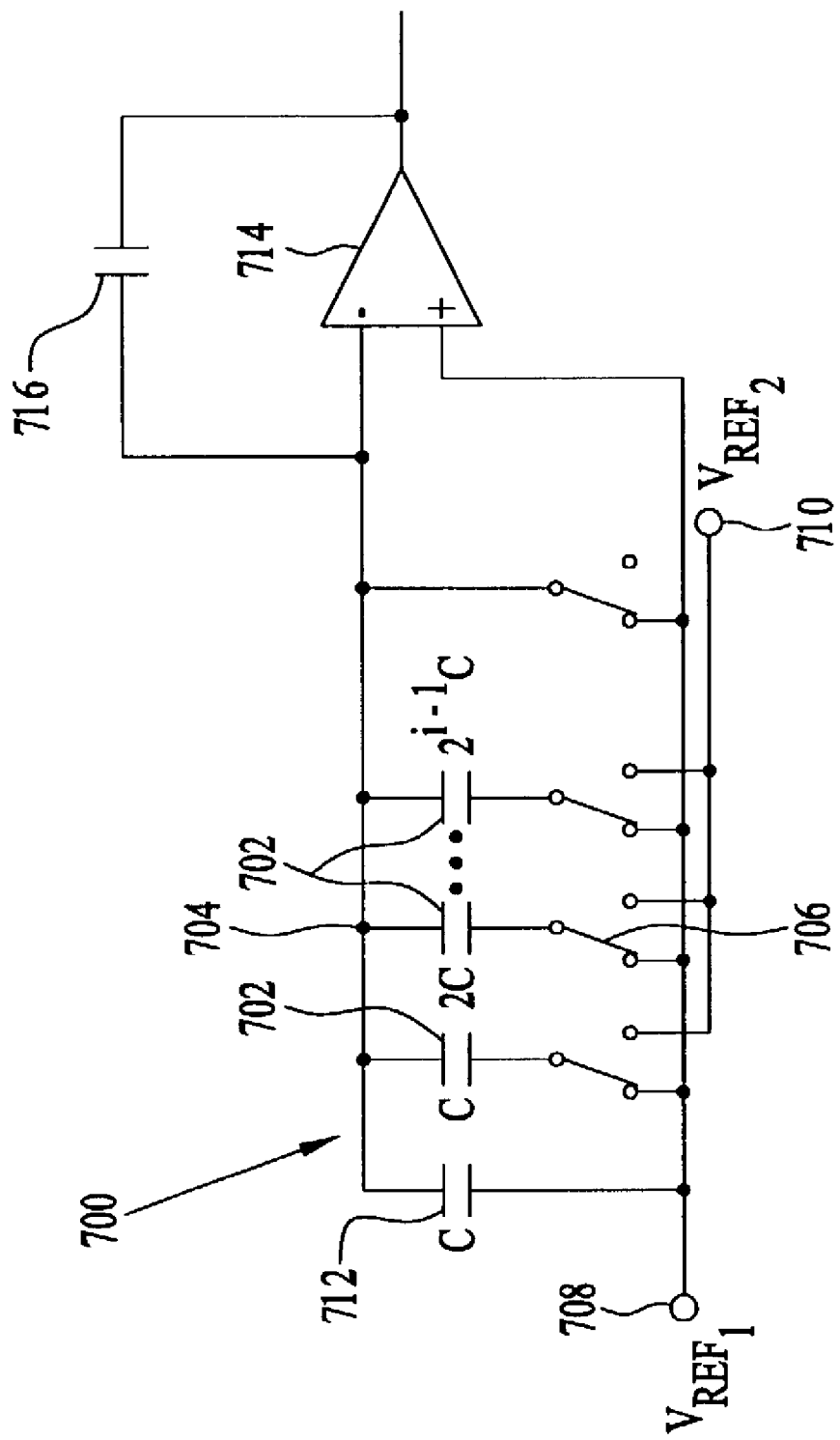
FIG. 7 illustrates a schematic diagram of a digital-to-analog converter, in accordance with the high precision microelectromechanical capacitor with programmable voltage source.

FIG. 7 illustrates a schematic of a digital-to-analog converter (DAC) 700, in accordance with the high precision microelectromechanical capacitor with programmable voltage source. DAC 700 includes a binary-weighted array of capacitors 702, where each capacitor is substantially two times the preceding capacitor (C, 2C, 4C, 8C, . . . , $2^{i-1}$C, where i is the number of binary bits of the system).

Each of capacitors 702 may include a trim capacitor 104, capacitance actuator 106, programmable voltage source 108, and fixed capacitor 102 as shown in FIG. 1 and as was previously described. Each capacitor 702, being individually addressable, thus allows adjustments of each capacitor 702 such that the appropriate ratios of the binary-weighted capacitor array may be obtained.

Referring again to FIG. 7, capacitors 702 are connected to common node 704, which may be connected to amplifier 714. Although amplifier 714 is shown with feedback capacitor 716, any appropriate amplification method may be implemented in DAC 700. Each capacitor 702 is also connected to a switch 706 for switching the capacitor between two reference voltages 708 and 710. Also included in DAC 700 is optional bypass capacitor 712.

Figure 8:
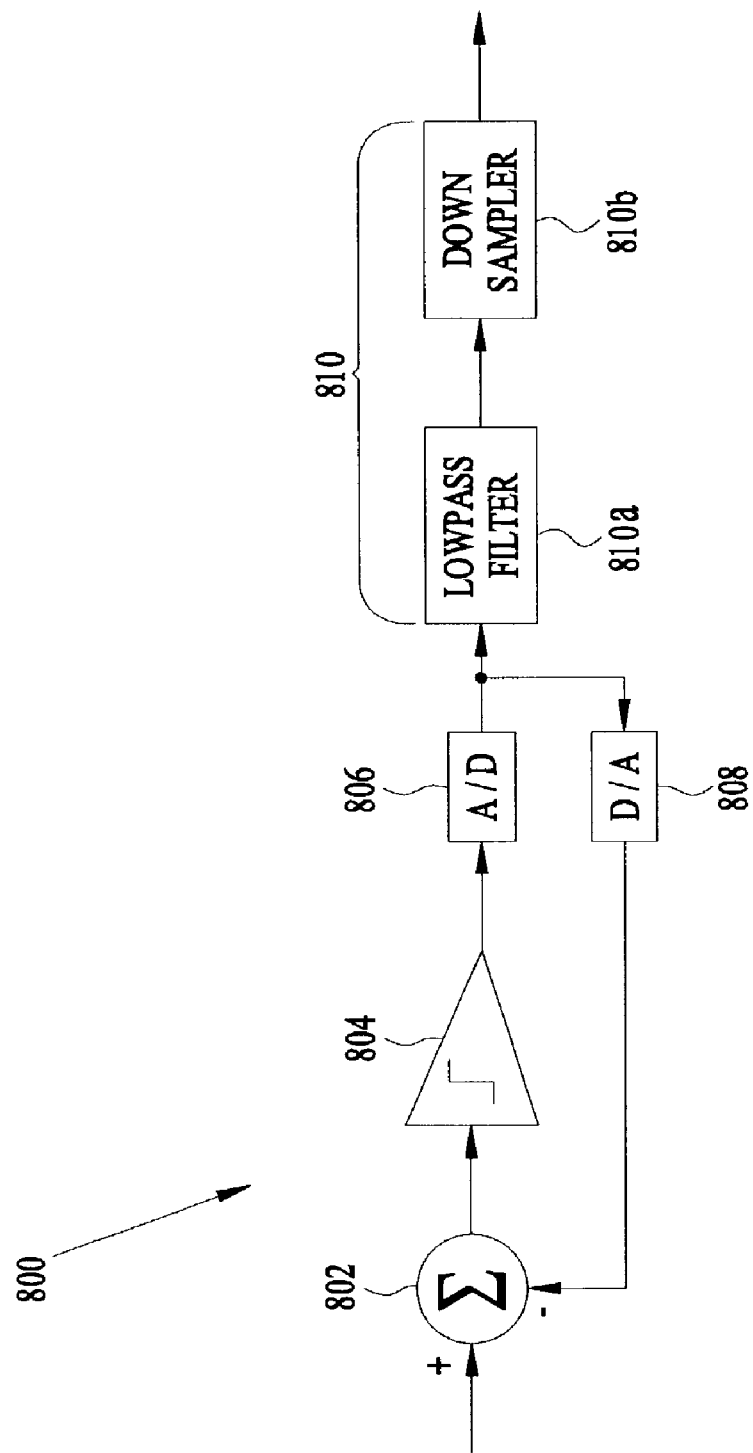
FIG. 8 illustrates a block diagram of a SIGMA-DELTA, analog-to-digital converter in accordance with the high precision microelectromechanical capacitor with programmable voltage source.

FIG. 8 illustrates a block diagram of a SIGMA-DELTA analog-to-digital converter (SIGMA-DELTA ADC) 800, in accordance with the high precision microelectromechanical capacitor with programmable voltage source. SIGMA-DELTA ADC 800 includes a voltage comparator 802, an integrator 804, and an analog-to-digital converter 806. SIGMA-DELTA ADC 800 also includes a high-precision digital-to-analog converter (DAC) 808, as shown in FIG. 9 and as was previously described. The increased linearity of the high-precision DAC may help allow the SIGMA-DELTA ADC 800 to achieve, for example, 16-bit, 100 Msps, 96-100 dB accuracy.

SIGMA-DELTA ADC 800 optionally includes digital decimator 810, which includes a lowpass filter 810a and a down sampler 810b.

The method of making a high precision MEMS capacitor with programmable voltage source includes forming a trim capacitor having a continuously-adjustable capacitance value, forming a capacitance actuator mechanically coupled to and electrically isolated from the trim capacitor, and forming a programmable voltage source, all on one monolithic substrate.

The trim capacitor is preferably designed for making fine adjustments in capacitance when optionally coupled to a fixed capacitor, which could alternatively be formed on or off the substrate. Adjustments of the trim capacitor are controlled by the capacitance actuator, which could be a capacitor or alternatively any form of mechanical or electrostatic actuation for adjusting the trim capacitor. Such actuation may optionally include piezoelectric actuation.

By way of example, FIG. 3 illustrates a mechanical coupling between the capacitance actuator 106 and the trim capacitor 104. It is noted that FIG. 3 is not shown to scale and that dimensions varying from those shown may be implemented. As shown, the method could include forming a first stationary electrode 306 and a second movable electrode 308 for the trim capacitor 104, on substrate 300. In addition, forming a third stationary electrode 302 and a fourth movable electrode 304 for the capacitance actuator 106 is provided. Between the movable and fixed electrodes a shared flexible dielectric layer 310 is also formed. The flexible dielectric layer 310 allows for the deflection of electrodes 302 and 304, caused by an electrostatic force created by application of a voltage potential between them. This deflection of flexible dielectric layer 310 also results in movement of the trim capacitor's electrode 308, such that the capacitance of the trim capacitor is changed. Preferably, the changes in capacitance of trim capacitor 104 are relatively small when compared with the changes in capacitance of capacitance actuator 106. One way this may be accomplished is by utilizing the inherent roughness of the materials used for the trim capacitor's electrodes 306 and 308 and the flexible dielectric layer 310. Thus, as the capacitance actuator's electrodes are deflected, the contact force between the trim capacitor's electrodes changes, thereby changing the effective dielectric area between electrodes 306 and 308 and causing a very fine variation of capacitance in trim capacitor 104. With the proper choice of materials along with the appropriate thickness of the flexible dielectric layer 310, microphonics may be reduced or eliminated. It may be appreciated that other methods of varying the capacitance may be implemented, some of which include methods where electrode 306 does not contact, or may only partially contact, dielectric layer 310.

The capacitance actuator controls the capacitance of trim capacitor in response to a highly accurate and stable voltage potential supplied by the programmable voltage source formed on the substrate. Programmable voltage source is formed, on substrate 300, to output this voltage potential in response to control signals provided by optional control circuitry.

An example of the programmable voltage source formed on the substrate is shown in FIG. 2A as a hot-electron/tunneling circuit 200. The floating-gate of a floating-gate transistor is connected to the negative input 206 of an amplifier 202 with feedback capacitor CF 204. This pins the floating-gate voltage to $V_{REF}$ 208 and allows $V_{OUT}$ 210 to be moved from rail to rail by changing the charge of the floating gate 206. Charge is removed from the floating gate 206 through tunneling. The tunneling voltage 220 is switched by high voltage AND gate 218, which may include a high-voltage differential amplifier built with lightly doped-drain nFETs. The capacitive coupling of the tunneling voltage to the floating gate 206 is counterbalanced by switching a lower compensation voltage 230 with NAND gate 228 through a larger capacitor 236. Tunneling control signals 222, 224, 232, and 234 are used for controlling the previously described tunneling by gates 218 and 228 and may optionally include discrete digital signals. These tunneling control signals may be provided by optional control circuitry 110, as shown in FIG. 1.

Charge is added to floating-gate 206 through hot-electron injection by injection circuit 212. Two examples of injection circuits 212a and 212b are shown in FIGS. 2B and 2C, respectively. Injection circuit 212a utilizes a nFET 238, while injection circuit 212b utilizes a pFET 252. In both injection circuits 212a and 212b an inverter 240 is used in the compensation circuitry to offset the capacitive coupling into the floating gate 206 through the drain-to-channel capacitor. Injection control signals 214, 216, 246, and 248 are used for controlling the previously described hot-electron injection by injection circuits 212, 212a, and 212b and may optionally include discrete digital signals. These injection control signals may be provided by optional control circuitry 110, as shown in FIG. 1.

The method of making a high precision MEMS capacitor with programmable voltage source may also include a process for forming a plurality of trim capacitors, each with their own capacitance actuator and programmable voltage regulator, as described previously. Each trim capacitor may be formed in parallel or in series with a fixed capacitor such that, the relative capacitance of each trim capacitor/fixed capacitor combination results in a binary weighted array of capacitors, where the capacitance of each capacitor combination may be adjusted so that their capacitance value is substantially two times the previous capacitor (C, 2C, 4C, 8C, ..., $2^{i-1}$C, where i is the number of binary bits needed for the system). Such a binary weighted array of capacitors may be utilized in a digital-to-analog converter, where the additional circuitry is optionally formed on the same substrate.

Figure 5:
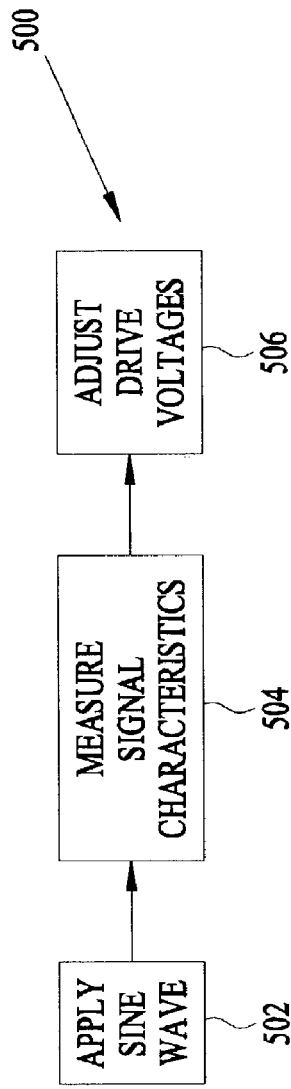
FIG. 5 illustrates a flow-chart for adjusting drive voltages of a digital to analog converter, in accordance with the high precision microelectromechanical capacitor with programmable voltage source.

The method of making a high precision MEMS capacitor with programmable voltage source may also include a process for adjusting the capacitance values of a DAC 500 as illustrated in a flow chart in FIG. 5. The process includes the steps of: 502 applying a practically ideal sine wave of digital data to the DAC; 504 measuring the signal characteristics such as, distortion ratio, SNR, and quantization error; and 506 adjusting the programmable voltage source of the necessary trim capacitors in response to these measurements.

Figure 6:
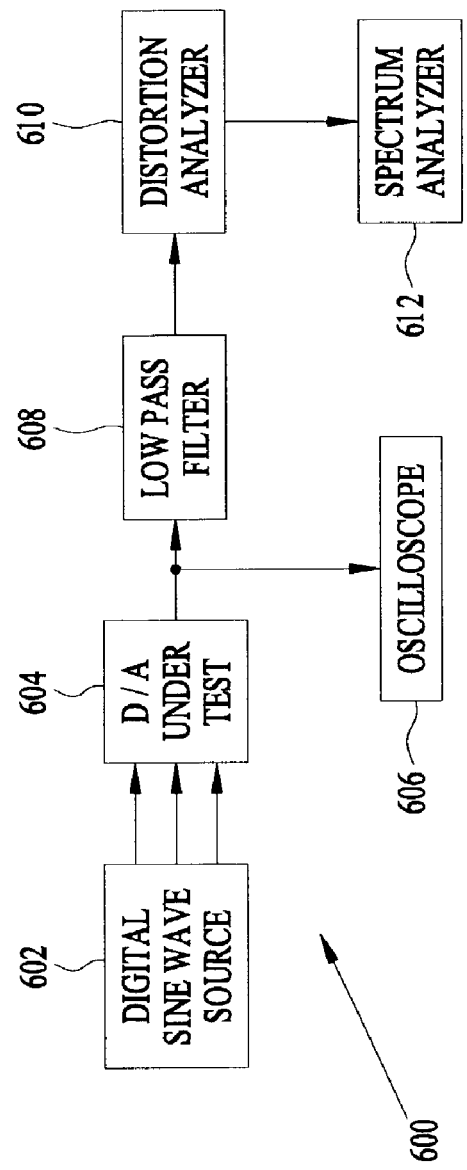
FIG. 6 illustrates a block diagram for adjusting drive voltages of a digital to analog converter, in accordance with the high precision microelectromechanical capacitor with programmable voltage source.

FIG. 6 shows a block diagram of an example of one possible test setup 600 for testing and adjusting the capacitance values of the DAC, in accordance with the high precision MEMS capacitor with programmable voltage source. First, test setup 600 includes a digital sine wave source 602 coupled to the DAC 604 to be tested. Next, optional oscilloscope 606 analyzes the high-speed analog output of the DAC 604. In addition to passing to optional oscilloscope 606, the output of the DAC 604 is passed through low-pass filter 608, which rejects the repeated spectra around the sampling frequency and multiples of the sampling frequency. Low pass filter 608 applies the baseband to the analog distortion analyzer 610. The monitor output of the distortion analyzer along with spectrum analyzer 612 contains all the signal information except the fundamental signal needed for measuring quantization error, distortion ratio, and SNR.

We claim:

1. A monolithic microelectromechanical device comprising:
   a trim capacitor having a continuously-adjustable capacitance value;
   a capacitance actuator coupled to control said continuously-adjustable capacitance value;
   wherein said trim capacitor further comprises:
     a first electrode; and
     a movable second electrode disposed a first distance from said first electrode, said first distance adjustable by said capacitance actuator to change said continuously-adjustable capacitance value;
   wherein said capacitance actuator comprises:
     a third electrode; and
     a movable fourth electrode disposed a second distance from said third electrode, said second distance adjustable responsive to an electrostatic force between said third and forth electrodes corresponding to said voltage potential;
a programmable voltage source for generating a voltage potential corresponding to a control signal, wherein said voltage potential controls said capacitance actuator,
wherein said programmable voltage source includes:
an amplifier having an input and output terminal; and
a floating-gate transistor wherein a floating gate of said transistor is coupled to said input terminal for storing a charge value; and
a shared flexible dielectric layer disposed between said first and second electrodes and extending between said third and fourth electrodes, said dielectric layer being movable with respect to a substrate, said dielectric layer comprising a first surface with a first roughness disposed between said electrodes; wherein,
said first electrode has a second surface with a second roughness;
such that said first surface opposes said second surface, thereby forming an effective area of substantial contact, said area of substantial contact being responsive to movements of said second electrode, thereby changing said continuously-adjustable capacitance value.

2. The monolithic microelectromechanical device as recited in claim 1, wherein said programmable voltage source further comprises:
means for selectively causing electrons to inject onto said floating-gate, thereby increasing said stored charge value and said voltage potential; and
means for selectively causing electrons to tunnel from said floating-gate, thereby decreasing said stored charge value and said voltage potential.

3. The monolithic microelectromechanical device as recited in claim 1, wherein said programmable voltage source further comprises a feedback capacitor coupled between said input and output terminals.

4. The monolithic microelectromechanical device as recited in claim 2, wherein said control signal comprises:
an injection control signal for initiating said electron injection; and
a tunneling control signal for initiating said electron tunneling.

5. The monolithic microelectromechanical device as recited in claim 1, wherein said capacitance actuator is mechanically coupled to and electrically isolated from said trim capacitor.

6. The monolithic microelectromechanical device as recited in claim 1, wherein said capacitance actuator has a capacitance value, said capacitance value being larger than said continuously-adjustable capacitance value.

7. The monolithic microelectromechanical device as recited in claim 1, wherein said first and third electrodes are fixed with respect to said substrate and said second and fourth electrodes are attached to said flexible dielectric layer, wherein movement of said fourth electrode causes movement of said second electrode.

8. The monolithic microelectromechanical device as recited in claim 1, wherein said capacitance actuator further comprises piezoelectric material.

9. The monolithic microelectromechanical device as recited in claim 1, wherein said programmable voltage source is non-volatile.

10. The monolithic microelectromechanical device as recited in claim 1, wherein said monolithic microelectromechanical device includes a digital to analog converter.

11. The monolithic microelectromechanical device as recited in claim 10, wherein said digital to analog converter further comprises a capacitor network comprising:
a plurality of said trim capacitors;
a plurality of said capacitance actuators;
a plurality of said programmable voltage sources; and
a plurality of fixed capacitors each coupled to at least one said trim capacitor;
wherein, the relative capacitance of each combination of said trim capacitor coupled with said fixed capacitor is substantially $C, 2C, 4C, 8C, \ldots, 2i-1C$, respectively, where i is the number of binary bits.

12. The monolithic microelectromechanical device as recited in claim 1, wherein said monolithic microelectromechanical device includes a SIGMA-DELTA analog to digital converter.

13. The monolithic microelectromechanical device as recited in claim 12, wherein said SIGMA-DELTA analog to digital converter further comprises:
(a) a voltage comparator for generating an output signal responsive to an analog input signal;
(b) a first integrator operably coupled to said voltage comparator, said integrator for receiving said output signal of said comparator;
(c) an analog to digital converter operably coupled to said first integrator for generating a first digital output signal responsive to said analog input signal;
(d) a digital to analog converter operably coupled to said analog to digital converter for generating an analog feedback signal to said comparator, said analog feedback signal responsive to said first digital output signal, said digital to analog converter comprising:
a plurality of said trim capacitors;
a plurality of said capacitance actuators;
a plurality of said programmable voltage sources; and
a plurality of fixed capacitors each coupled to at least one said trim capacitor;
wherein, the relative capacitance of each combination of said trim capacitor coupled with said fixed capacitor is substantially $C, 2C, 4C, 8C, \ldots, 2i-1C$, respectively, where i is the number of binary bits.

14. The monolithic microelectromechanical device as recited in claim 13, wherein said digital to analog converter further comprises a second integrator operably disposed between said first integrator and said analog to digital converter.

15. The monolithic microelectromechanical device as recited in claim 13, wherein said digital to analog converter further comprises a digital decimator operably coupled to said analog to digital converter for generating a second digital output signal responsive to said first digital output signal.

16. A monolithic microelectromechanical device comprising:
a trim capacitor having a continuously-adjustable capacitance value;
a capacitance actuator coupled to control said continuously-adjustable capacitance value;
wherein said trim capacitor further comprises:
a first electrode; and
a movable second electrode vertically disposed a first distance from said first electrode, said first distance adjustable by said capacitance actuator to change said continuously-adjustable capacitance value;

wherein said capacitance actuator comprises:
  a third electrode; and
  a movable fourth electrode vertically disposed a second distance from said third electrode, said second distance adjustable responsive to an electrostatic force between said third and forth electrodes corresponding to said voltage potential;
a programmable voltage source for generating a voltage potential corresponding to a control signal, wherein said voltage potential controls said capacitance actuator,
wherein said programmable voltage source includes:
  an amplifier having an input and output terminal; and
  a floating-gate transistor wherein a floating gate of said transistor is coupled to said input terminal for storing a charge value; and a shared flexible dielectric layer disposed between said first and second electrodes and extending between said third and fourth electrodes, said dielectric layer being movable with respect to a substrate, said dielectric layer comprising a first surface with a first roughness disposed between said electrodes; wherein,
said first electrode has a second surface with a second roughness;
such that said first surface opposes said second surface, thereby forming an effective area of substantial contact, said area of substantial contact being responsive to movements of said second electrode, thereby changing said continuously-adjustable capacitance value.

* * * * *